May 25, 1965 J. D. FAIRBAIRN 3,184,824
METHOD FOR PLATING A SUPPORT FOR A SILICON WAFER IN THE
MANUFACTURE OF A SEMICONDUCTOR DEVICE
Filed March 27, 1963

John D. Fairbairn
INVENTOR
BY Melvin Sharp
ATTORNEY

United States Patent Office 3,184,824
Patented May 25, 1965

3,184,824

METHOD FOR PLATING A SUPPORT FOR A SILICON WAFER IN THE MANUFACTURE OF A SEMICONDUCTOR DEVICE

John D. Fairbairn, Richardson, Tex., assignor to Texas Instruments Incorporated, Dallas, Tex., a corporation of Delaware Filed Mar. 27, 1963, Ser. No. 268,328
9 Claims. (Cl. 29—25.3)

Figures 1, 2, 3, 4, 5:
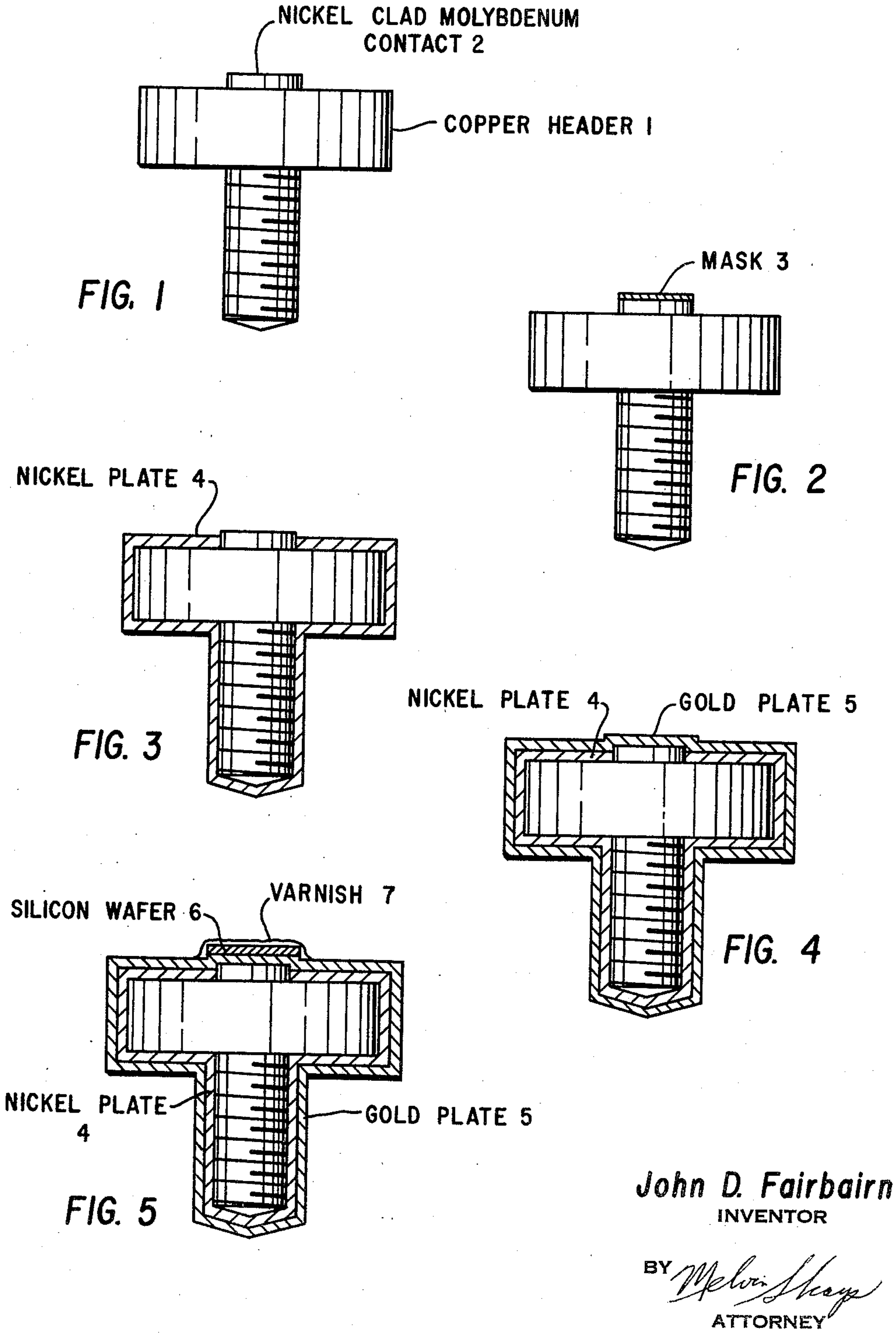

The invention relates generally to a method of manufacturing a semiconductor device such as a rectifier or a transistor in which a silicon wafer is secured to a support including a header and a high heat conducting metal intermediate the header and the silicon wafer. More particularly, the invention relates to a method for plating the support prior to securing the wafer thereto.

In the manufacture of a diffused silicon power transistor, it is general practice to secure the collector region of the silicon wafer to a support which includes a copper header having a molybdenum contact attached thereto intermediate the silicon wafer and the copper header. The purpose of such a support is to rapidly and efficiently dissipate the heat developed in the transistor during its use. While silicon has the ability to provide good electrical operation at high temperatures, its most efficient electrical operation occurs at lower temperatures. Therefore by reason of its high thermal conductance, the support dissipates the heat developed in the transistor and maintains the latter at its most efficient operating temperature. Additionally the molybdenum contact intermediate the fragile silicon wafer and the copper header has a thermal coefficient of expansion similar to that of the silicon wafer and thus minimizes mechanical stress therein.

The manufacture of a semiconductor power device, and in particular the securing of the silicon wafer to the support, has resulted in many difficult problems, some of which are the protection of the silicon wafer against impurity contamination from adjacent materials and the reliability of the device during its life as affected by the materials adjacent the wafer.

Accordingly, it is an object of the invention to provide a method for plating the support in a novel manner prior to securing the silicon wafer thereto, whereby the silicon wafer is protected against impurity contamination from adjacent material when it is being secured to the support.

Another object of the invention is to provide a method for plating the support in a novel manner prior to securing the silicon wafer thereto and thus produce a more reliable semiconductor device.

Still another object of the invention is to provide a method for manufacturing a more reliable silicon power transistor.

The invention, in a preferred embodiment, provides a method for plating a support including a copper header having a molybdenum contact attached thereto prior to the step of securing the silicon wafer to the exposed face of the molybdenum contact. Specifically, the exposed face of the molybdenum contact is masked, the header and the unmasked surface of the contact are nickel-plated, the mask is removed, the header and contact are gold-plated, and the silicon wafer is then secured to the gold-plated face of the molybdenum contact. The semiconductor device is then encapsulated to produce the finished product. Plating the support in the above manner and then securing the silicon wafer thereto results in a semiconductor device having the copper header nickel-plated and gold-plated, and the contact face to which the wafer is to be secured only gold-plated. Generally, the silicon wafer will have a nickel-plate bonded to its surface adjacent the contact and the contact will have a nickel-clad thereon adjacent the wafer. It is not the purpose of the invention to exclude these nickel coatings from the area between the wafer and the contact since these coatings are extremely thin and do not adversely effect the reliability of the device during its operation. However, it is the purpose of the invention to exclude the nickel-plate which is applied to the copper header from the area between the wafer and the contact because said nickel-plate in this area would laminate during operation and result in an unreliable device.

The foregoing and other objects, features and advantages of the invention will be apparent from the following detailed description taken in conneciton with the appended claims and attached drawings in which:

FIGURE 1 illustrates a conventional support including a copper header and nickel-clad molybdenum contact attached thereto, FIGURE 2 illustrates a mask applied to the exposed face of the molybdenum contact according to one step of the invention, FIGURES 3 and 4 illustrate plating steps according to the invention, FIGURE 5 illustrates the silicon wafer secured to the plated support.

FIGURE 1 illustrates the support to be plated, which includes a copper header 1 and a molybdenum contact 2 having a nickel-clad brazed thereon. The support is characterized by its high thermal conductance and its low electrical resistance. Such a support is conventional for a semiconductor wafer in a silicon transistor power device and need not be described in further detail.

FIGURES 2–4 illustrate generally the masking and plating of the support according to the invention. A mask 3 is applied to the exposed face of the molybdenum contact as shown in FIGURE 2. The mask may be any means which prevents nickel-plating from adhering to the masked face of the molybdenum contact. A suitable mask would be number 470 type masking tape produced by the Minnesota Mining and Manufacturing Company. After the exposed face of the molybdenum contact is masked, the copper header and the unmasked surface of the contact are nickel-plated and the resulting structure is illustrated in FIGURE 3. The mask is then removed and the support is gold-plated, the resulting structure being shown in FIGURE 4. It can be seen from FIGURE 4 that face of the contact to be secured to the silicon wafer is only gold-plated and the copper header is both nickel-plated and gold-plated.

Referring to FIGURE 5, in the manufacture of a power transistor, the collector region of the silicon wafer 6 having a thin nickel-plate bonded to its lower surface is secured to the exposed face of the molybdenum contact by placing the wafer on the contact, applying varnish 7 over the wafer and baking the unit, for example, at 270° C. for 72 hours. The nickel-plating around the copper header has particular utility in the baking operation since it acts as a diffusion barrier between the copper header and the gold-plate and silicon wafer, thus protecting the silicon wafer from impurity contamination in the baking operation.

Summarizing, the nickel-plate 4 is excluded from the area between the contact and the wafer, whereby the semiconductor device is made more reliable during its life. Additionally the nickel-plate 4 around the copper header acts as a diffusion barrier and protects the silicon wafer against impurity contamination from adjacent materials.

By way of example, a detailed procedure for plating a support such as that illustrated in FIGURE 1 is given below:

Assume that the effective surface area of the support is 1.7 square inches; the applied nickel-plate thickness is to be 100±15 micro inches and the gold-plate thickness is to be 70±20 micro inches.

*Detailed procedure*

(I) Clean support:
- (A) Degrease 3–5 minutes
- (B) Alkaline cleaner for 2–3 minutes
- (C) Two-stages water rinse, 5 seconds each stage
- (D) Bright dip using nitric sulphuric acid for 2–3 seconds
- (E) Two-stage water rinse, 5 seconds each stage
- (F) Descale using "Fidelity 161" (an inhibited hydrochloric acid solution manufactured by Fidelity Chemical Products Corporation, Newark, New Jersey) for 2–3 minutes
- (G) Two-stage water rinse, 5 seconds each stage
- (H) Light acid gold strike by electroplating using 8–9 volts for 5 minutes to prevent copper header from oxidizing due to the bright dip
- (I) Two-stage water rinse, 5 seconds each stage
- (J) Rinse with warm water for 10 seconds
- (K) Dry gently with compressed air (II) Mask exposed face of moylbdenum contact (III) Prepare for nickel-plating:
- (A) Activate unmasked surface of the support with solution containing 50% HCl for 2–3 minutes
- (B) Two-stage water rinse, 5 seconds each stage
- (C) Light acid gold strike by electroplating using 8–9 volts for 3 minutes
- (D) Water rinse, 5 seconds (IV) Nickel-plate unmasked surface of the support by electroplating using 13 amps for 40 minutes or 520 amp minutes (V) Clean nickel-plated support:
- (A) Two-stage water rinse, 5 seconds each stage
- (B) Warm water rinse
- (C) Dry with air (VI) Remove mask (VII) Prepare for gold-plating:
- (A) Hot trichlorethylene spray or ultrasonic clean with hot trichlorethylene for 5 minutes
- (B) Cyanide wash with agitation for 2 minutes
- (C) Water rinse, 5 seconds
- (D) Activate nickel-plated support with solution containing 50% HCl for 2–3 minutes
- (E) Water rinse, 5 seconds
- (F) Light acid gold strike by electroplating using 8–9 volts for 4 minutes
- (G) Two-stage water rinse, 5 seconds each stage (VIII) Acid gold-plate the nickel-plated support by electroplating using 3.5 amps for 38 minutes or 133 amp minutes (IX) Clean:
- (A) Dragout (solution saver) rinse
- (B) Two-stage rinse with de-ionized water, 5 seconds each stage
- (C) Hot water rinse, 10 seconds
- (D) Dry It is to be understood that the above described procedure is merely illustrative of the invention. Numerous other procedures may be devised by those skilled in the art without departing from the spirit and scope of the invention as defined by the appended claims.

What is claimed is:

1. A method for plating a support on which a silicon wafer is to be secured, which support includes a header and a metal contact attached thereto, comprising the steps of:

(*a*) masking the exposed face of the contact,
(*b*) nickel-plating the header and the unmasked surface of the contact,
(*c*) removing the mask,
(*d*) and gold-plating the header and the contact.

2. The method of claim 1, further including the step of securing a silicon wafer to the gold-plated face of the contact.

3. A method for plating a support on which a silicon wafer is to be secured, which support includes a copper header and a molybdenum contact attached thereto, comprising the steps of:
(*a*) masking the exposed face of the contact,
(*b*) nickel-plating the header and the unmasked surface of the contact,
(*c*) removing the mask,
(*d*) and gold-plating the header and contact.

4. A method for plating a support for a silicon wafer having a nickel-plate bonded on one surface, which support includes a copper header and a nickel-clad molybdenum contact attached thereto, comprising the steps of:
(*a*) masking the exposed face of the nickel-clad molybdenum contact,
(*b*) nickel-plating the header and the unmasked surface of the contact,
(*c*) removing the mask,
(*d*) and gold-plating the header and contact.

5. The method of claim 4, further including the step of attaching the nickel-plated surface of the silicon wafer to the gold-plated face of the contact, thereby securing the silicon wafer to the support.

6. A method for plating a support for a silicon wafer in the manufacture of a semiconductor device, which support includes a copper header and a nickel-clad molybdenum contact attached thereto, comprising the steps of:
(*a*) masking the exposed face of the nickel-clad molybdenum contact,
(*b*) nickel-plating the copper header and the unmasked surface of the contact,
(*c*) removing the mask,
(*d*) gold-plating the header and the contact,
(*e*) and securing the silicon wafer to the gold-plated contact.

7. The method of claim 6, wherein the silicon wafer includes a nickel-plate bonded to one surface, which surface is secured to the gold-plated face of the contact.

8. In a method for manufacturing a silicon power transistor, wherein the collector region of a silicon wafer is secured to a high thermal conductance support including a header and metal contact attached thereto intermediate the header and wafer, the steps of plating the support prior to securing the wafer comprising:
(*a*) masking the exposed face of the contact,
(*b*) nickel-plating the header and the unmasked surface of the contact,
(*c*) removing the mask,
(*d*) and gold-plating the header and the contact.

9. The method of claim 8, wherein the header is copper and the metal contact is nickel-clad molybdenum and wherein the collector region of the silicon wafer has a nickel-plate bonded to its surface, which surface is secured to the gold-plated contact.

No references cited.

RICHARD H. EANES, Jr., *Primary Examiner.*

WHITMORE A. WILTZ, *Examiner.*